United States Patent [19]
Groom et al.

[11] Patent Number: 5,783,370
[45] Date of Patent: Jul. 21, 1998

[54] PANELIZED PRINTED CIRCUIT CABLES FOR HIGH VOLUME PRINTED CIRCUIT CABLE MANUFACTURING

[75] Inventors: John Michael Groom, Scotts Valley; Chau Chin Low, Santa Cruz, both of Calif.

[73] Assignee: Seagate Technology, Inc., Scotts Valley, Calif.

[21] Appl. No.: 685,705

[22] Filed: Jul. 24, 1996

[51] Int. Cl.[6] .............................. G03C 5/00; H05K 7/02; H05K 3/30
[52] U.S. Cl. .............................. 430/318; 269/903; 29/832; 29/837; 361/760; 430/319; 430/320
[58] Field of Search .............................. 430/318, 319, 430/320; 361/760; 269/903; 29/831, 832, 837, 834

[56] References Cited

U.S. PATENT DOCUMENTS

| | | | |
|---|---|---|---|
| 4,830,985 | 5/1989 | Araghi et al. | 437/209 |
| 5,034,802 | 7/1991 | Liebes et al. | 357/74 |
| 5,044,615 | 9/1991 | Newman et al. | 269/231 |
| 5,210,922 | 5/1993 | Carr | 29/426.3 |
| 5,263,632 | 11/1993 | Zadrick et al. | 228/49.1 |
| 5,364,277 | 11/1994 | Crumly et al. | 439/67 |
| 5,438,740 | 8/1995 | Carr et al. | 29/33 P |

*Primary Examiner*—Janet C. Baxter
*Assistant Examiner*—Rosemary Ashton
*Attorney, Agent, or Firm*—Flehr Hohbach Test Albritton & Herbert LLP

[57] ABSTRACT

An assembly for high volume production of printed circuit cables consisting of: a plurality of printed circuit cables 10 cut from a polyimide base sheet 30 coated with a layer of copper and further coated with a photo-imaging material layer, wherein copper layer and photo-imaging material layer are photo-etched away at certain locations, a cover layer 34 applied on top of said printed circuit cables 10, cover layer 34 extending laterally from printed circuit cables 10, and forming tabs 16 at a plurality of locations, and a panel 20 having a plurality of apertures 15 cut therein, apertures 15 each dimensioned to receive a printed circuit cable 10 therein, and tabs 16 being connected to panel 20. A worknest 50 having certain areas 52 raised to different heights, worknest 50 adapted to be positioned under and provide support to the plurality of printed circuit cables 10. A cutting device 60 being adapted to cut tabs 16 thereby enabling printed circuit cables 10 to be removed from panel 20.

16 Claims, 7 Drawing Sheets

PANELIZED PRINTED CIRCUIT CABLES FOR HIGH VOLUME PRINTED CIRCUIT CABLE MANUFACTURING

FIELD OF THE INVENTION

The present invention relates to high volume manufacturing of flexible printed circuit cables, especially printed circuit cables for use in computer hard disc drives.

BACKGROUND OF THE INVENTION

Printed circuit cables are flat flexible cables with a circuit imprinted thereon, and electrical components installed thereto, and are formed to have a particular shape. This shape enables the circuit on the printed circuit cable to flex and be connected to the various electrical components as found in an electrical system such as a computer hard disc drive. In such systems, the shape of the printed circuit cables is unique to the particular design of the head disc assembly. The body of the printed circuit cable has to be large enough to accommodate a connector and the cable must have a long neck which allows itself to move or flex during the operation of the hard drive. When a controller reads from, or writes to, a hard disc, an arm moves in an arc within the hard drive assembly, positioning a read/write head at a location above a spinning disc. As this arm moves back and forth in an arc, the long neck of the printed circuit cable is adapted to flex millions of times without breaking or damage.

The particular shape of the fabricated printed circuit cable is dictated by the particular design and positioning of the internal components of the computer hard disc drive. For example, a printed circuit cable could be used to connect the drive controller to the read/write heads in a computer hard disc drive. Having a flat, flexible sheet-like structure, the final printed circuit cable is able to be easily connected to other fixed position electrical components found elsewhere in the hard disc drive system. Having an electrical circuit imprinted thereon, printed circuit cables perform the function of transferring useful electronic information between the hard disc drive media and the drive controller.

Although printed circuit cables are typically used in computer disc drives, similar cables are also designed for use in the computer printers, particularly at locations where a stationary electrical component is attached to a moving electromechanical component such as a printer head. At these locations, the flexible cable is able to simultaneously maintain electrical contact with a stationary and a moving electrical component.

The manufacturing of printed circuit cables typically begins with the particular shape of the cables being cut from a flexible light-weight base material such as polyimide, which is typically provided in large rolls. The printed circuit cables are typically arranged from this polyimide sheet in a manner such that a large number of the printed circuit cables will be made while producing a minimum amount of waste in the polyimide roll.

Printed circuit cables are produced by covering a layer of photo-imaging material on a copper coated polyimide base layer in a dark room environment. The base layer is then photo-imaged in a photo-developer, with the printed circuit cable design made on photographic artwork. The exposed photo-imaging material on the base layer is polymerized when the base layer is sent through the photo-developer. The non-polymerized photo-imaging material is then removed to expose the copper areas on the base layer that will not form part of the electrical circuit.

These exposed copper areas are chemically etched away, leaving behind the desired electrically conductive pattern of copper substrate on the printed circuit cable design. The polymerized photo-imaging material is then removed to have this pattern of copper substrate exposed.

A final top cover layer is then laminated over the top of the printed circuit cables. This top layer is typically also manufactured of polyimide such as was used in forming the base layer. The purpose of this cover layer is to protect the final printed circuit on the cable. Before lamination to the base layer, this top cover layer of the printed circuit cable first has all the desired openings, where electrical connections will be performed later, removed by a die punch. The resulting printed circuit cable is then punched into individual units.

These printed circuit cables are then electrically tested and visually mechanically inspected before they are sent for a stiffener lamination process where the printed circuit cables are individually hand removed from the transportation trays and placed on a work surface where a stiffener, typically pieces of a sheet metal, are attached to the underside of the printed circuit cable at various locations. The stiffeners act to prevent bending of the printed circuit cable which could damage the circuit imprinted thereon, especially after the attachment of various electrical components to the cables as set out below. These stiffeners are applied to the bottom of the printed circuit cables such that small gaps remain between the various stiffeners on the bottom of each cable. These gaps between the stiffeners are positioned to run along certain lines along the bottom of the cables such that the cables are free to bend around these lines only, in the manner of a seam-type joint and such that they will not tend to bend at locations where electrical components are attached to the circuit cables. Accordingly, these stiffeners are mounted along the bottom of the printed circuit cables to give them a firm non-bending structure, except along those certain lines that the cables are designed to bend about to reach the various internal components in the disc drive, in particular the E-Block.

Following this, the printed circuit cables are baked, cleaned and packed on transportation trays before shipment to the printed circuit cable assembly plant.

Upon arrival at the assembly facility, the individual printed circuit cables are hand removed one-by-one from the transportation trays. The removed printed circuit cables are then manually placed onto the worknest of a manual solder paste screen printer, with locating pins holding the printed circuit cables in position. This worknest fixture typically holds only three printed circuit cables at one time. After the solder paste is dispensed onto specific locations of the printed circuit cables, the printed circuit cables are then manually transferred onto work carriers called pallets. These pallets are fixtures made from the machining of high temperature epoxy glass composite with tooling pins inserted onto them. After the printed circuit cables are mounted onto the pallets, a metallic cover plate is secured over the printed circuit cables. Typically, a pallet holds five printed circuit cables.

These pallets are then manually placed onto magazines before they are transferred to a Pick & Place equipment station. A standard magazine can hold 25 pallets. At the Pick & Place equipment station, the pallets are automatically transferred from the magazines onto the equipment, where electrical components such as a resistor, capacitor, connector and Flip Chip are mounted. The function of these electrical components is for the amplification of the electrical signals to and from the read/write heads to the hard disc controller/ PCB. This is done so that the signal to noise ratio is large enough for the controller to receive the actual electrical signals instead of other unwanted signals or noise.

The pallets are then transferred to a reflow oven by means of a conveyor belt connected between the equipment. In the reflow oven, the solder paste melts and forms a solder joint or weld connecting the electrical components to the printed circuit cables.

The printed circuit cables on the pallets exiting from the reflow oven are then manually removed from the pallets and are transferred to cleaning baskets for aqueous washing. Cleaning baskets are typically metallic cages in which printed circuit cables are placed, strapped and locked in position before they are placed onto the aqueous cleaning machine. One cleaning basket typically holds about 24 to 30 printed circuit cables, depending on the printed circuit cable dimensions. This aqueous cleaning process is required to remove all foreign materials and flux stain on the printed circuit cables before they are functionally tested.

Upon completion of this aqueous cleaning, the printed circuit cables are then manually removed from the cleaning basket and hand placed back onto the transportation tray which typically holds about 24 to 30 printed circuit cables, depending on the printed circuit cables dimensions.

From this transportation tray, individual printed circuit cables are then mounted onto a test fixture which has alignment pins and a pneumatic mechanism in a tester clamp which holds the printed circuit cables in position for the functional testing. Each test fixture holds only one printed circuit cable, but the operator typically uses two separate test fixtures simultaneously to load two printed circuit cables. The defective printed circuit cables are identified and removed while the good printed circuit cables are placed directly onto the transportation trays.

The printed circuit cables are then removed one at a time from the transportation trays and placed onto a metal stiffener bending station. The metal stiffener bending is done by means of a mechanical fixture powered by a pneumatic cylinder. This post assembly metal stiffener bending step forms the printed circuit cables into their final product stage where they can mounted and fit into a head disc assembly of a computer disc drive.

After the metal stiffeners are bent, the printed circuit cables are sent to an aqueous cleaning machine for a final clean. The printed circuit cables are placed into cleaning baskets before being sent through the aqueous cleaning machine. These cleaning baskets form a net-like structure above and below the cables which holds the printed circuit cables such that both their top and bottom surfaces are exposed for aqueous cleaning as the cleaning basket then is passed through the aqueous cleaning machine. After the printed circuit cables are cleaned, they are removed from the cleaning basket and placed into shipping trays. The shipping trays are stacked and vacuumed sealed before shipment to a head disc assembly plant.

Accordingly, the manufacturing of printed circuit cables presently requires considerable cleaning and handling considerations, requiring the hand loading and unloading of many transportation trays and cleaning baskets. As can be seen, the above process for producing printed circuit cables involves a considerable amount of handling by human operators as individual printed circuit cables are continually being removed from one sort of container or carrying device and placed into another. The potential for contamination or damage to the printed circuit cables is enhanced considerably due to this excessive human handling.

Accordingly, very clean conditions must be maintained during this process with the operators wearing gloves and the workrooms kept exceptionally clean. In addition, this continual transferring of individual printed circuit cables between the various stages of production in this process requires considerable time, material and tooling cost, and human intervention in producing these printed circuit cables.

Consequently, there is a need for a simple and cost effective system for assembling, testing, cleaning and metal stiffener bending of printed circuit cables omitting the steps of having to individually transfer these printed circuit cables between various transportation trays, pallets, mounting fixtures, cleaning baskets and shipping trays during the assembly process. Performing this entire assembly process without having to continuously move and reposition each of the individual printed circuit cables would save considerable time and cost as well as reduce the potential for contamination or destruction of the final product.

Lastly, the problem of stack-up tolerances also exist in this present method of producing printed circuit cables. Specifically, when printed circuit cables are manufactured, there are separate tolerances in the different layers of the cables, (ie: cover layer, base layer, metal stiffener, etc.). The stack-up tolerance represents the added cumulative effect of each of these separate tolerances which can interfere with the testing of the cables, especially as cable designs become smaller. Reducing stack-up tolerances would be a great benefit in producing printed circuit cables.

SUMMARY OF THE INVENTION

It is an object of the present invention to provide an assembly and method for high volume simultaneous production of a plurality of printed circuit cables which minimizes product cost and human intervention.

It is another object of the present invention to provide an assembly and method for high volume production of printed circuit cables wherein a plurality of printed circuit cables are simultaneously held in position in cut-out apertures of a panel by way of an integral cover layer that is applied to the printed circuit cables forming a plurality of tabs which extend laterally from the printed circuit cables with these tabs each being connected to the panel. These tabs are preferably made of polyimide and the panel is preferably made of aluminum or an epoxy glass composite.

It is another object of the present invention to provide a panel which is used to simultaneously transport and position a plurality of printed circuit cables through all the steps of adding photo-imaging material and polyimide top cover layers, adding stiffeners, bending metal stiffeners, adding electronic components like connectors and Flip Chips, aqueous cleaning, product functional testing and final pack-out.

It is another object of the present invention to provide an assembly and method of high volume production of printed circuit cables wherein a supporting worknest comprising a metal block having certain areas raised to different heights is positioned under, and provides support to, a plurality of printed circuit cables which are suspended in the cut-out apertures of a panel during the time that electrical connectors and Flip Chips are being soldered to the top surface of these printed circuit cables.

It is another object of the present invention to provide an assembly and method for high volume production of printed circuit cables wherein polyimide tabs integral to the cover layer of the printed circuit cables hold a plurality of printed circuit cables in a fixed position suspended in cut-out apertures in the panel such that printed circuit production, testing and aqueous cleaning can all be performed when the printed circuit cables are attached to the panel.

It is another object of the present invention to provide an assembly and method for high volume production of printed circuit cables wherein polyimide tabs integral to the printed circuit cables suspend a plurality of printed circuit cables in a fixed position in cut-out apertures of a panel, with the printed circuit cables held slightly away from the edges of these apertures such that these printed circuit cables can be easily removed from the panel by an automated cutting system which separates the tabs on the printed circuit cables from the panel.

It is another object of the present invention to provide an assembly and method for high volume production of printed circuit cables which eliminates the need for pallets, cleaning baskets, mounting fixtures and transportation trays which are presently all required in single unit sequential assembly of printed circuit cable operations.

It is another object of the present invention to provide an assembly and method for high volume production of printed circuit cables wherein the position of the printed circuit cables relative to the panel is constant and predictable to within small tolerances such that, by knowing only the position of the panel, an in-line computer controlled automated solder paste screen printer can dispense solder paste on a plurality of printed circuit cables attached to a panel, and subsequently a computer controlled Pick & Place equipment can place and connect various electrical components and Flip Chips to the printed circuit cables. In this way, all the printed circuit cables on the panels can be tested automatically with a conveyorized in-line system.

It is another object of the present invention that a pattern of cut-out apertures be made in a panel in which the printed circuit cables are to be suspended is designed such that the pattern of cut-out apertures in the panel is identical when viewed from any of two opposed ends of the panel and therefore the panel can be rotated 180 degrees without changing the relative location of the apertures and the individual printed circuit cables suspended therein.

It is another object of the present invention to provide an assembly and method for high volume production of printed circuit cables wherein the position of the printed circuit cables relative to the panel apertures in which they are suspended is constant and predictable within such small tolerances such that, by knowing only the positioning of a cutting system which operates to separate the individual printed circuit cables from the panel by cutting through tabs extending from the printed circuit cables which hold the printed circuit cables within the panel apertures. This cutting system preferably comprises a rotary cutting blade, although other cutting systems such as low power lasers could be used.

It is another object of the present invention to provide an assembly and method for high volume production of printed circuit cables wherein a panel having apertures in which the printed circuit cables are suspended is made of a material able to withstand the high water temperature and pressure of the aqueous cleaning process while holding the printed circuit cables in position. This panel is preferably made from aluminum or an epoxy glass composite material.

It is another object of the present invention to provide an assembly and method for high volume production of printed circuit cables wherein a panel holding printed circuit cables has apertures cut therein in which the printed circuit cables are suspended such that both the top and bottom surfaces of the printed circuit cables are easily and openly accessible during aqueous cleaning as the panel is moved through an aqueous cleaner.

It is another object of the present invention to provide an assembly and method for high volume production of printed circuit cables wherein a panel holding printed circuit cables has apertures cut therein in which the printed circuit cables are suspended by tabs extending from the integral top surface of the cables are easily accessible such that stiffeners can be attached to this bottom surface of these printed circuit cables while the cables are still suspended in the apertures in the panel.

It is another object of the present invention to provide an assembly and method for high volume production of printed circuit cables wherein a panel holding the printed circuit cables in apertures therein acts as a temporary stiffener such that the printed circuit cables do not bend about unnecessarily before they are removed from the panel.

It is another object of the present invention to reduce the problem of stack-up tolerances.

Additional objects of the present invention will become apparent from and are set forth in more detail in the description of the Best Mode of Carrying Out the Invention and in the accompanying drawings.

DISCLOSURE OF THE INVENTION

Disclosed in the present invention is an assembly for high volume production of printed circuit cables consisting of:

a plurality of printed circuit cables, said printed circuit cables cut from a polyimide base sheet coated with a layer of copper and further coated with a photo-imaging material layer, wherein said copper layer and said photo-imaging material layer are photo-etched away at certain locations, a cover layer applied on top of said printed circuit cables, said cover layer extending laterally from said printed circuit cables, and forming tabs at a plurality of locations, and a panel having a plurality of apertures cut therein, said apertures each dimensioned to receive a printed circuit cable therein, said tabs being connected to said panel.

Also disclosed is a worknest having certain areas raised to different heights, said worknest adapted to be positioned under and provide support to said printed circuit cables, for use with said assembly for high volume production of the printed circuit cables. Further disclosed is a cutting device being adapted to cut said tabs thereby enabling said printed circuit cables to be removed from said panel.

In addition to the above apparatus, the following method is also disclosed. Specifically, the method of forming an assembly for high volume production and assembly of printed circuit cables consisting the sequentially performed steps of: cutting a plurality of identical shaped pieces from a copper coated polyimide base sheet, applying a photo-imaging material layer over the top of said copper layer, photo-imaging away said copper layer and said photo-imaging material layer at a plurality of locations on said pieces, applying a cover layer on top of said pieces, said cover layer forming a plurality of tabs which extend laterally from said printed circuit cables at a plurality of locations thereby forming tabs, and providing a panel with a plurality of apertures cut therein, said apertures each dimensioned to received one of said pieces therein and said tabs connecting said each of said pieces to said panel.

DETAILED DESCRIPTION OF A PREFERRED EMBODIMENT

The present manufacturing of the printed circuit cables for use in computer hard disc drives requires individual printed circuit cables to be sequentially cut and assembled using various photo-etching, aqueous cleaning and electrical and microscopic testing techniques. In particular, the individual printed circuit cables are typically cut in a particular shape from a material such as copper coated polyimide which forms its flexible base layer. On top of this base layer, a layer of photo-imaging material is applied in a variety locations such that the remaining copper on the polyimide base layer are removed by a chemically etching process, to comprise a partially completed circuit. A final polyimide top cover layer is then applied to the top surface of the printed circuit cables and plurality of metallic stiffeners are attached to the bottom side of the cables. In addition, electrical connectors and Flip Chips are then soldered onto these printed circuit cables, thus forming a complete electrical circuit. As these printed circuit cables are individually and sequentially produced, this process requires considerable handling and transferring of printed circuit cables in and out of various transportation trays, pallets, mounting fixtures, cleaning baskets, machines and shipping trays. All this handling requires considerable time and expense and increases the likelihood of contamination and damage to the printed circuit cables. A more simple and cost effective solution to these problems, as shown by the present apparatus and method, is a system for assembling, cleaning and testing printed circuit cables while they are attached to a panel with this panel being constructed to be moved from machine-to-machine and process-to-process while the printed circuit cables are attached thereto, thus overcoming the need to individually handle each printed circuit cable during any of the various steps of the manufacturing operations.

Figure 1:
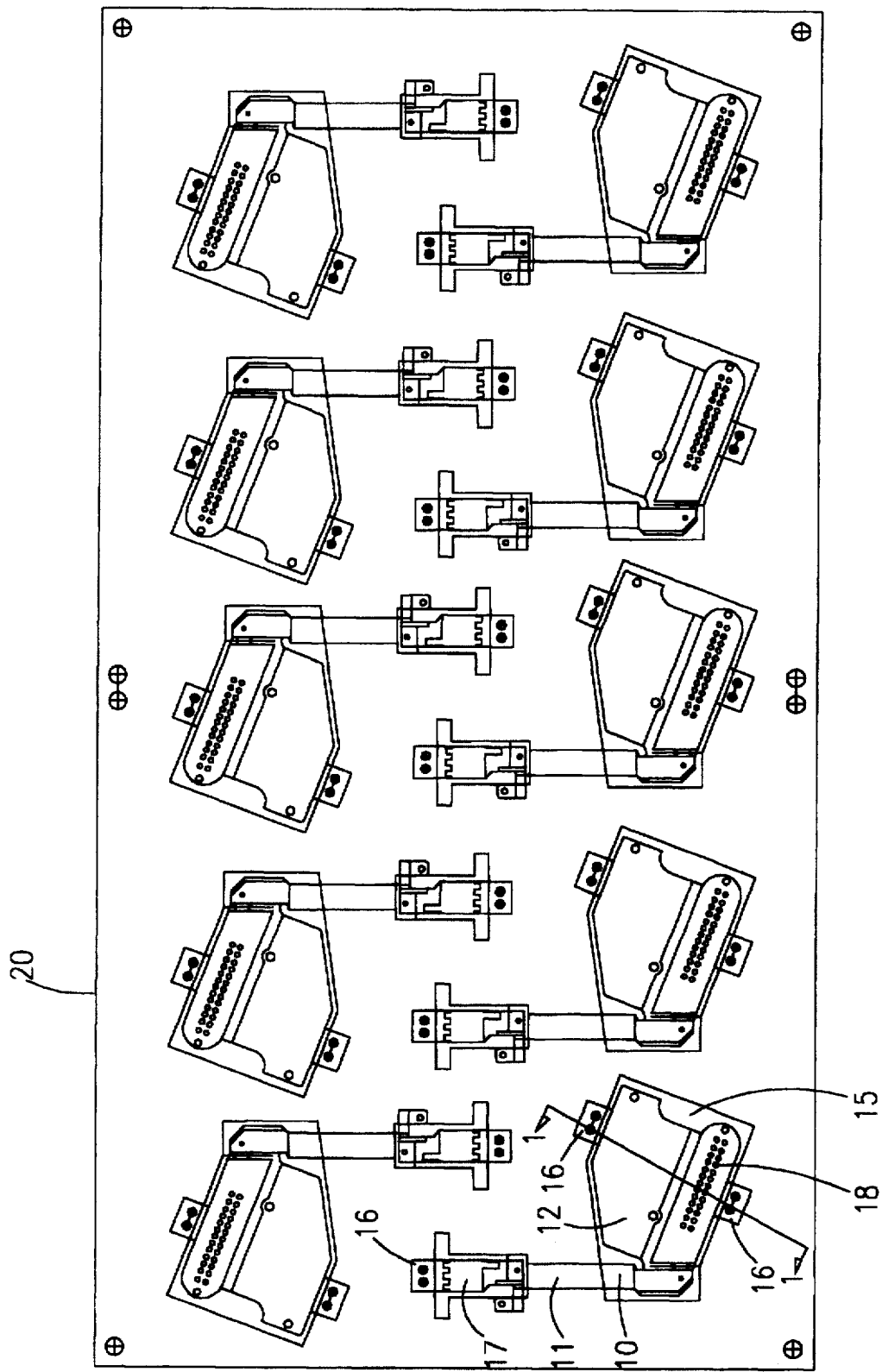
FIG. 1 is a top plan view of an assembly for high volume production of printed circuit cables comprising a panel with apertures cut therein having printed circuit cables suspended in these apertures by tabs extending laterally from the top side of the printed circuit cables as produced in accordance with the present invention.

As is best seen in FIG. 1, a plurality of printed circuit cables 10 are received in to apertures 15 of a panel 20. As is seen in FIG. 1, ten printed circuit cables are received into ten apertures. This embodiment as shown is meant to be illustrative only and the present invention is not limited to having exactly this number, size or shape of apertures, nor shape of printed circuit cables. It is necessary, however, that the printed circuit cables used are received into apertures of roughly the same shape as the cables, with the apertures being only slightly bigger in size, but similar in shape to the desired printed circuit cables. Accordingly, a major feature of the present invention is that the printed circuit cables 10 and panel apertures 15 have a sufficiently narrow gap found between all sides of each printed circuit cable 10 and the edge of apertures 15 in panel 20.

This panel is preferably made from aluminum or an epoxy glass composite material such as sold under the trade name FR4. The material was chosen as the most suitable for the panel to be fabricated because of its rigidity and its ability to withstand the high solder reflow temperature when the printed circuit cables are placed into the reflow oven as detailed below.

Figure 2:
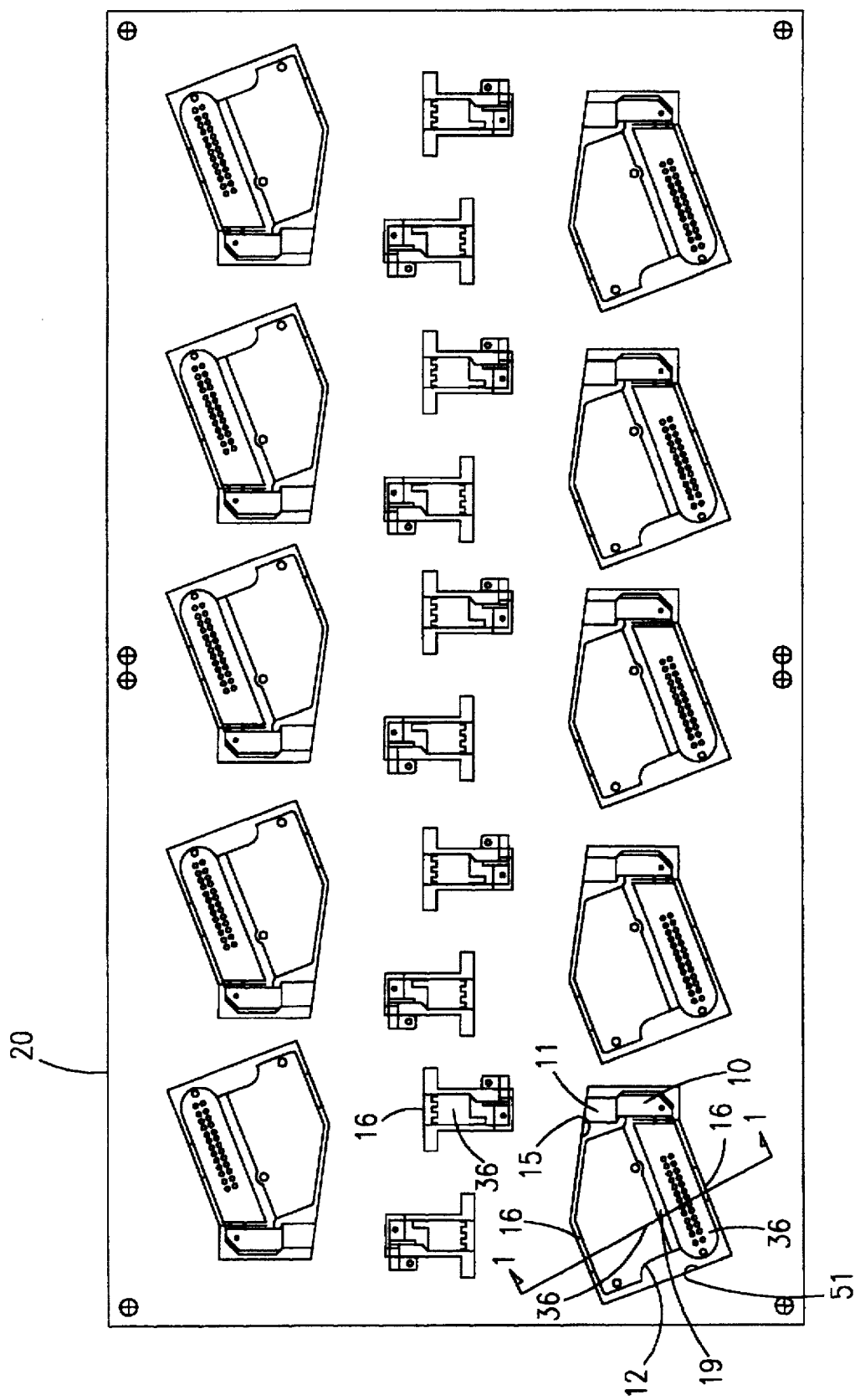
FIG. 2 is a bottom plan view of an assembly for high volume production of the printed circuit cables comprising a panel with apertures cut therein having printed circuit cables suspended in these apertures by tabs extending laterally from the top side of the printed circuit cables as produced in accordance with the present invention.
Figure 3:
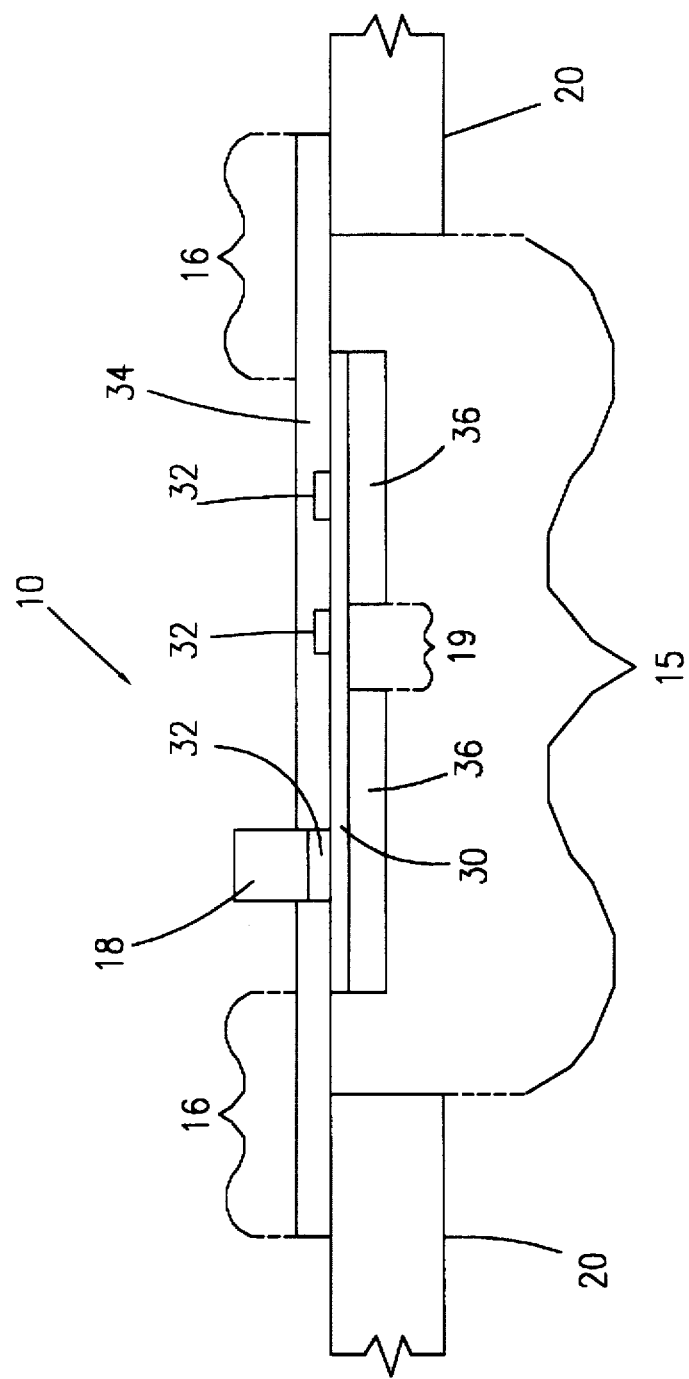
FIG. 3 is an exaggerated depth side cross-section 1 view taken along line 1—1 in FIGS. 1 and 2.

The structure and composition of the printed circuit cables 10 is more clearly revealed when viewing FIGS. 1 and 2 in conjunction with FIG. 3 which shows an exaggerated depth side cross sectional view of one of the assemblies in FIGS. 1 and 2, as taken along line 1—1.

The formation of each printed circuit cable assembly is accomplished in the following steps. First, identically shaped pieces are cut from a polyimide material which is thin, light-weight and flexible and is typically provided in a large roll. These pieces of polyimide will be cut into the particular shape as shown so as to be finally positioned in the computer hard disc drive. In the present invention, as is best shown in FIG. 1, the polyimide piece is cut to have a long neck 11 and a somewhat large body portion 12. This neck 11 is designed to reach the E-Block assembly of the head disc assembly and the large body 12 is designed to connect the printed circuit cable to the hard disc controller.

As the polyimide piece 30, as shown in FIG. 3, forms the base upon which he printed circuit cable is to be fabricated, it will be cut in the exact shape of the assembled cable 10 as shown in FIG. 1. Returning to the view of FIG. 3, the polyimide sheet is coated with a copper layer on the surface followed by a layer of photo-imaging material. Using photo-imaging techniques, the copper and photo-imaging material layers are then removed at a variety of locations such that copper substrate strips 32 remain on the polyimide piece 30. These copper stripes 32 join together across the surface of the polyimide piece 30 in various patterns so as to define a partially completed electrical circuit.

Following this, a second layer of polyimide 34 is then applied to the top surface of the printed circuit cables. This layer is applied through the process of lamination which causes a firm adhesive connection to the top surface of the printed circuit cable. This polyimide layer 34 protects and seals the final printed circuit on the cable. This polyimide layer 34 is attached to the top surface of the cable 10 by the process of heat and pressure for a duration of time. In the present invention, as distinguished from prior art methods, the polyimide layer 34 extends beyond the edges of the printed circuit cable outline, to form tabs 16, (also seen in FIGS. 1 and 2), which extend to contact panel 20. The process of lamination ensures that these tabs 16 bond to the panel 20 such that the printed circuit cable 10 is held firmly in position in aperture 15 of panel 20, with only a small gap between cable 10 and panel 20 on both sides.

As the individual printed circuit cables 10 are now firmly attached to the panel 20, the positioning of all operations to be performed on the cables, and the holding of the cables during these operations is greatly facilitated as by simply holding and positioning the panel 20, these operations can easily be performed on a plurality of printed circuit cables 10. Accordingly, the position of the printed circuit cables relative to the panel is to be input into a computer for various computer controlled operations as detailed herein.

An added benefit of the use of panel 20 is the reduction of stack-up tolerances created by the cumulative tolerances of the separate layers of the cables and the mounting of the printed circuit cables to the various handling fixtures used during these operations as set out herein.

Continuing with the production of the printed circuit cables, the next computer controlled step is typically to have an electrical Open-Short testing machine that will test the printed circuit cables. By simply feeding panel 20 into a track feed of the machine, the Open-Short Tester can perform this testing, while the individual printed circuit cables are held in position by the panel 20. This avoids the prior art step of singly hand placing the individual printed circuit cables into and out of various transportation trays while testing these printed circuit cables.

Following this computer controlled step, panel 20, containing cables 10 is then placed on a lamination fixture where stiffeners 36 are mounted to the bottom side of the cable 10. These stiffeners 36 are best viewed in FIGS. 2 and 3. These stiffeners 36 are typically formed of aluminum and are attached to the polyimide base layer 30 by the process of heat and pressure applied for a duration of time. The function of these stiffeners 36 is to prevent excessive bending of the cable 10, which could damage the circuit imprinted thereon, especially after the attachment of various electrical components, as set out below. As it is desirable that cable 10 is bendable at certain locations, these locations forming seam type lines across the cable 10, stiffeners 36 are typically applied to cover only portions of the cable 10 such that a gap 19 runs between two of the various stiffeners 36. The printed circuit cable 10 is then free to bend about the line formed by gap 19 when eventually removed from its attachment to panel 20 as set out below.

Figure 4:
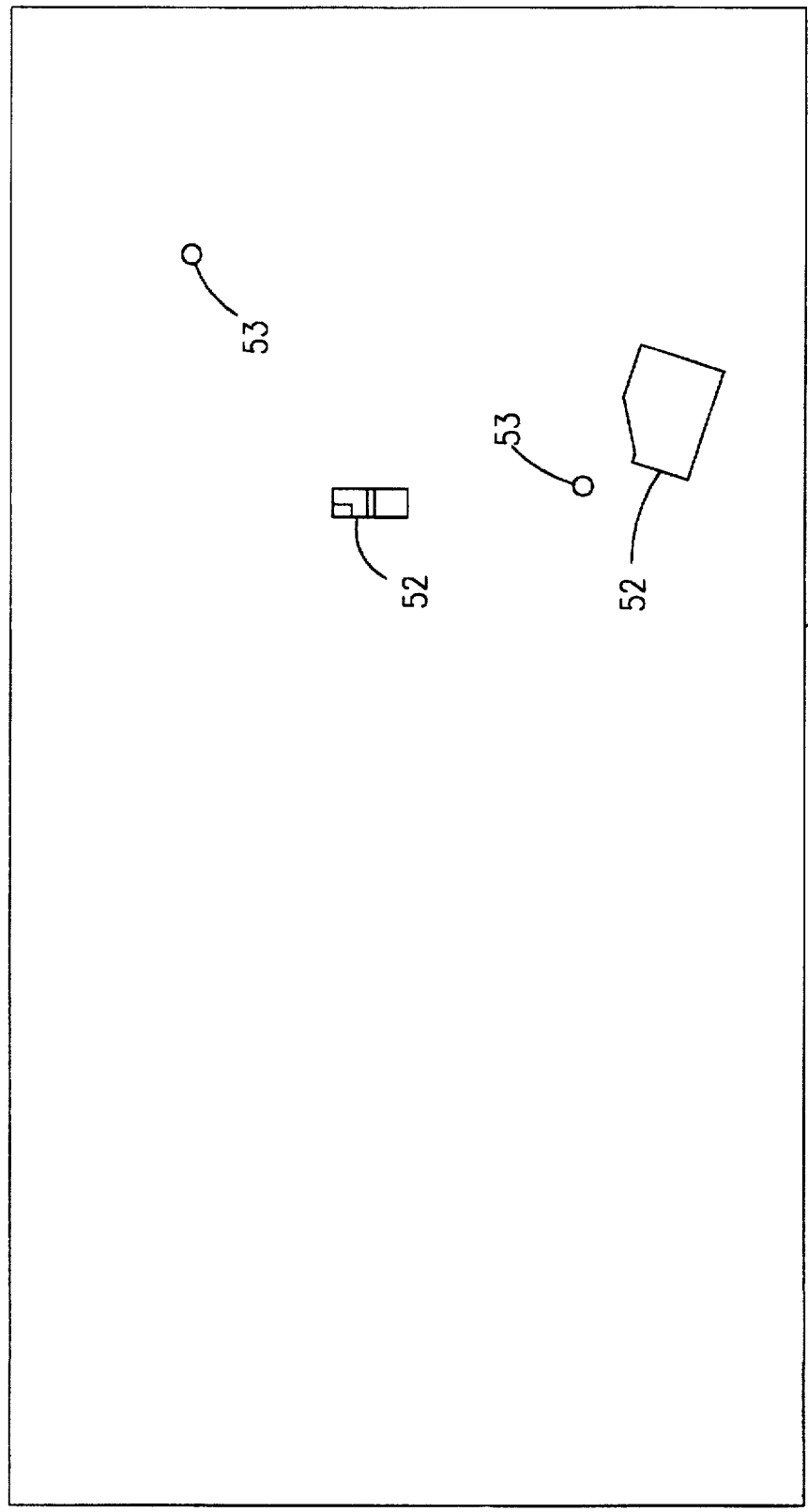
FIG. 4 is a top plan view of a worknest for supporting the bottom of the assembly as shown in FIGS. 1, 2 and 3.
Figure 5:
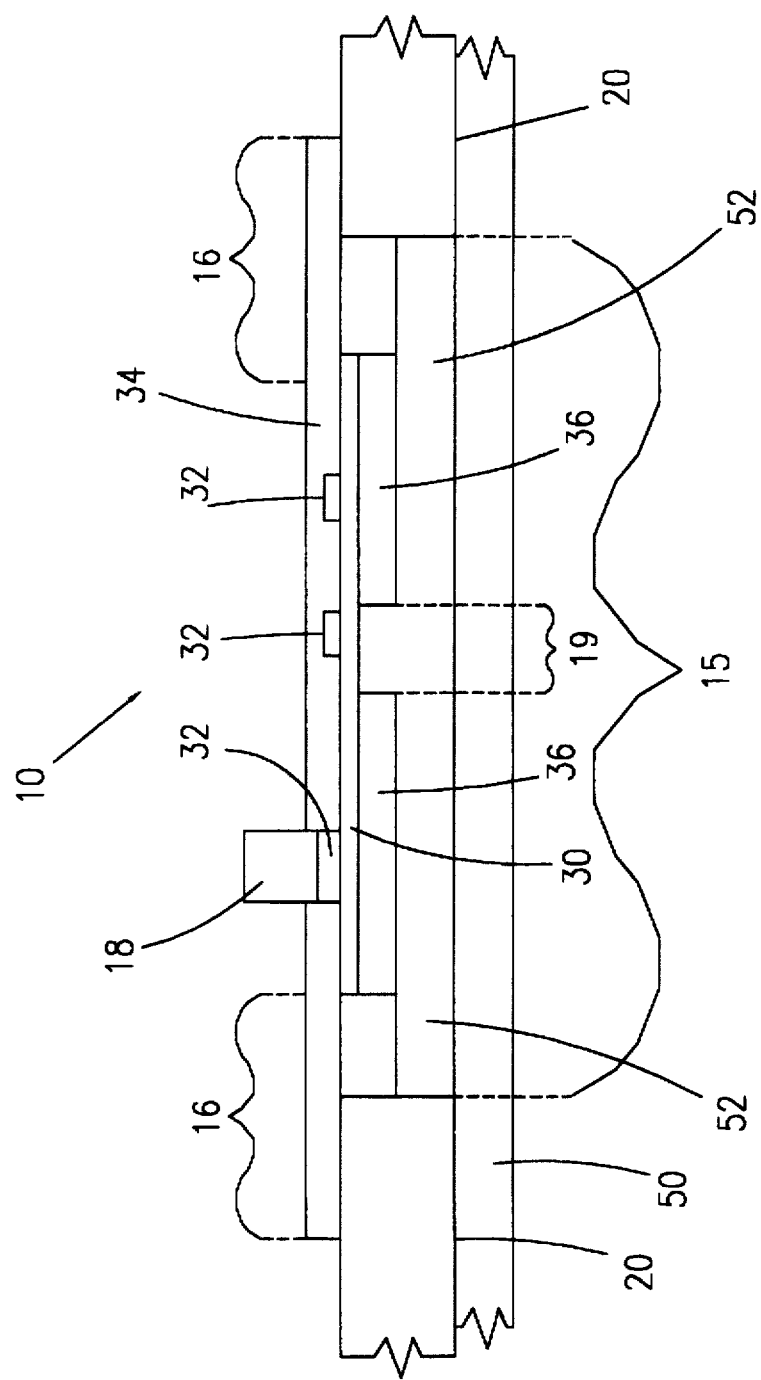
FIG. 5 is an exaggerated depth side cross-sectional view taken along line 1—1 in FIGS. 1 and 2, with a worknest supporting the bottom of the assembly.

In the next step of computer controlled operations, panel 20, containing cables 10 is then placed onto a track and is conveyed into a screen printing machine where solder paste is screen printed onto the printed circuit cables by means of a solder stencil and a metal squeegee. During the process of screen printing solder paste onto the printed circuit cables, a worknest 50, as shown in FIGS. 4 and 5, which is designed to mate with the underside of panel 20 and is made from aluminum provides a good and even support for the printed circuit cables. In order to prevent excessive stresses in the cables 10 and especially in the tabs 16, the worknest 50 will provide support.

Worknest 50 has a plurality of raised sections 52 which provide support to the bottom of cable 10 as these raised sections 52 are shaped to mate with the bottom surface of cable 10, and especially to rest under stiffeners 36, providing resistance to downward pressures on the top surface of the cable. This will ensure very consistent amount of solder paste will be dispensed onto each printed circuit cables.

The panel 20 is then transported to the next machine by the same track or conveyor system. The addition of electrical connector 18, passive components and the Flip Chip 17 are mounted and reflow soldered onto the printed circuit cables that will complete the circuit of the printed circuit cables. During this computer controlled component placement process, the printed circuit cables will be pushed downwards quite strongly by the machine's nozzle. In order to prevent excessive stresses in the cables 10 or and especially in the tabs 16, another worknest is provided, as was shown in FIGS. 4 and 5. This worknest 50 has a plurality of raised sections 52 which provide support to the bottom of cable 10 as these raised sections 52 are shaped to mate with the bottom surface of cable 10, and especially to rest under stiffeners 36, providing resistance to downward pressures on the top surface of the cable.

Upon completion of this step, panel 20 will separate from the worknest 50 when the machine indexes the panel out of the machine while a new panel is indexed into position. The panel 20 is then received into the aqueous cleaner which provides a thorough cleaning of the cables 10. One of the advantages the present invention is that both the top surface and the bottom surface of cable 10 are fully accessible to the cleaning fluids. Tabs 16 in no way hinder or prevent the cleaning fluids in the cleaner from cleaning both the top and bottom surfaces of the cables. The panels 20 are simply placed onto the stainless steel conveyor belt of the cleaner and heated water jets under high pressure are sprayed onto the printed circuit cables while they are being fed into the machine. Before the panels 20 exit from the cleaner, the printed circuit cables on the panel 20 are treated by a series of cold and hot air jets that dry off the printed circuit cables. Accordingly, this cleaning step is achieved without the requirement of removing the printed circuit cables 10 from the panel 20.

Figure 6:
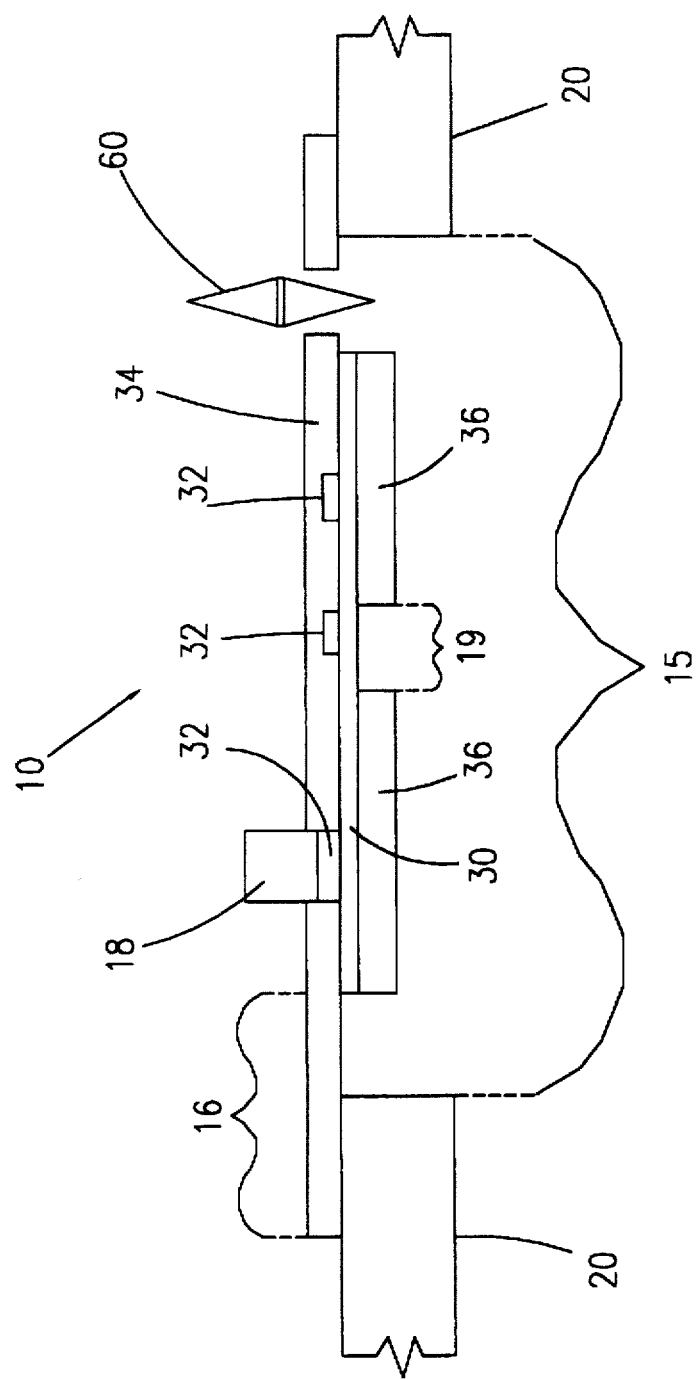
FIG. 6 is a exaggerated depth side cross-sectional view taken along line 1—1 in FIGS. 1 and 2, with a rotary blade cutting a tab.

As the assembly, computer controlled testing and cleaning of the printed circuit cables are achieved while the cables remain attached to the panel 20 by adhesive tabs 16, the individual printed circuit cables are finally removed from the panel as they are now in finished form. An added benefit of panel 20 holding the printed circuit cables 10 in apertures 15 therein acts as a temporary stiffener such that the printed circuit cables do not bend about unnecessarily before they are removed from the panel. Removal of these cables can be accomplished by any of a number of procedures that would sever tabs 16 so that cables 10 are cut free of the panel 20. As is seen in FIG. 6, a preferable method of severing tabs 16 is through a rotary cutting blade 60 which preferably has diameter larger than the width of tab 16 when viewed from directly above the panel. Accordingly, the rotary cutting blade 60 is lowered directly downward onto the center of tab 16 such that tab 16 will be cut from a central location on the tab outwards to both sides.

As the tabs 16 span a short gap between the printed circuit cable 10 and panel 20, the rotary cutting blade can be easily positioned to cut through the tabs while freely projecting downwards into this gap space. As the location of these tabs is known with respect to the panel, a computer can be programmed to automate the process of sequentially cutting these tabs for all printed circuit cables attached to a particular panel. As can been seen in FIGS. 1 and 2, the pattern of orientation of the printed circuit cables to the panel remains the same, even if the panel were rotated 180 degrees. Accordingly, the relative locations of the tabs with respect to the panel and the cutting device would not be altered by rotating the panel, thus enabling cutting of these tabs in either position without reprogramming any computer controlled location settings in the cutting system.

Figure 7:
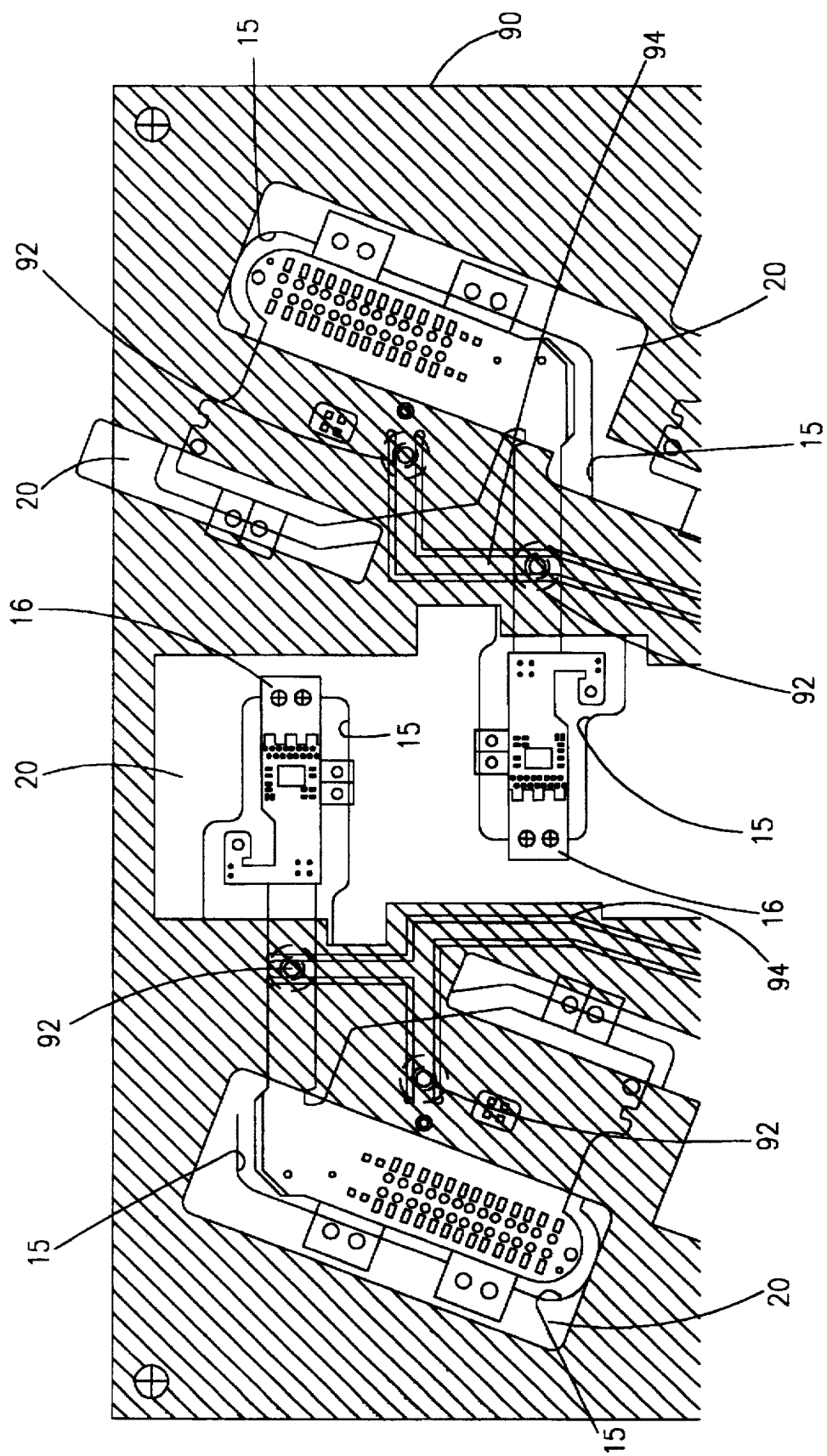
FIG. 7 is a top plan view of an equipment transfer plate as used in the depaneling process of the present invention.

As is best seen in FIG. 7, the depaneling step is accomplished through the use of an equipment transfer plate 90 which will hold the panel 20 down during the depaneling process and at the same time hold the individual printed circuit cables by means of suction cups 92 associated with each cable, along the vacuum track 94 in the transfer plate. This rotary cutting blade can typically be manufactured on the order of 0.5 millimeters thick and be programmed to cut 0.005 inches outside of the printed circuit cable outline, thus ensuring a sufficient clearance from the stiffeners mounted under the printed circuit cable. Transfer plate 90 has a series of openings which are designed to cover the areas above tabs 16. A cutting blade 60 is held in position by a high speed motor armature (not shown) and is lowered down by a robotic arm (not shown) to cut through tabs 16 through the openings in transfer plate 90.

We claim:

1. An assembly for simultaneously holding a plurality of printed circuit cables comprising:
   a. a plurality of printed circuit cables, said printed circuit cables formed from a polyimide base sheet coated with a layer of copper and further coated with a photo-imaging material layer, having said copper layer and said photo-imaging material layer photo-etched away at certain locations,
   b. a cover layer applied on top of said printed circuit cables, said cover layer extending laterally from said printed circuit cables, and forming laterally extending tabs at a plurality of locations, and
   c. a panel having a plurality of apertures passing therethrough, said apertures each dimensioned to receive a printed circuit cable therein, said laterally extending tabs being connected to said panel thereby supporting said printed circuit cable at a position entirely received in said aperture, said aperture affording simultaneous access to a top surface and a bottom surface of said printed circuit cable.

2. The assembly for simultaneously holding a plurality of printed circuit cables as set out in claim 1 further comprising:
   a worknest having certain areas raised to different heights, said worknest adapted to be positioned under and provide support to said printed circuit cables.

3. The assembly for simultaneously holding a plurality of printed circuit cables as set forth in claim 2 wherein,
   said worknest is formed from a monolithic block of aluminum.

4. The assembly for simultaneously holding a plurality of printed circuit cables of claim 2 further comprising,
   electrical components and Flip Chips mounted to said printed circuit cables.

5. The assembly for simultaneously holding a plurality of printed circuit cables as set out in claim 1 further comprising:
   a. a cutting device being adapted to cut said tabs thereby enabling said printed circuit cables to be removed from said panel.

6. The assembly for simultaneously holding a plurality of printed circuit cables as set forth in claim 5 wherein,
   said cutting device comprises a rotary cutting blade.

7. The assembly for simultaneously holding a plurality of printed circuit cables as set forth in claim 1 wherein,
   said panel is formed from aluminum.

8. The assembly for simultaneously holding a plurality of printed circuit cables as set forth in claim 1 wherein,
   said panel is formed from an epoxy glass resin.

9. A method of simultaneously fabricating a plurality of printed circuit cables consisting of the sequentially performed steps of:
   a. cutting a plurality of pieces from a polyimide base sheet, said polyimide base sheet being coated with a copper layer,
   b. applying a photo-imaging material layer over the top of said copper layer on each of said pieces,
   c. photo-imaging away said copper layer and said photo-imaging material layer at a plurality of locations on said pieces,
   d. applying a cover layer on top of said pieces, said cover layer being formed to extend laterally from said pieces at a plurality of locations thereby forming laterally extending tabs, and
   e. mounting said pieces in a panel with a plurality of apertures cut therethrough, each of said apertures being dimensioned to entirely receive one of said pieces therein and said laterally extending tabs connecting said each of said pieces to said panel thereby suspending said piece in said aperture at a position affording simultaneous access to a top surface and a bottom surface of said printed circuit cable.

10. The method of claim 9, further comprising:
    positioning said panel on top of a worknest, said worknest thereby providing support to said printed circuit cables.

11. The method of claim 9, further comprising:
    mounting electrical components on a top side of said printed circuit cables.

12. The method of claim 11, further comprising:
    said step of mounting is carried out by reflow soldering.

13. The method of claim 9, further comprising:
    mounting at least one stiffener to a bottom side of said printed circuit cables.

14. The method of claim 9, further comprising:
    aqueous cleaning of said printed circuit cables.

15. The method of claim 9, further comprising:
    severing said laterally extending tabs, thereby disconnecting said pieces from said panel.

16. The method of claim 15 wherein
    said step of severing is carried out by a rotary cutting blade passing through extending tabs.

* * * * *